United States Patent
Nagayama et al.

[11] Patent Number: 5,378,311
[45] Date of Patent: Jan. 3, 1995

[54] METHOD OF PRODUCING SEMICONDUCTOR DEVICE

[75] Inventors: Tetsuji Nagayama; Tetsuya Tatsumi, both of Kanagawa, Japan

[73] Assignee: Sony Corporation, Tokyo, Japan

[21] Appl. No.: 156,902

[22] Filed: Nov. 24, 1993

[30] Foreign Application Priority Data

Dec. 4, 1992 [JP] Japan .................. 4-325749

[51] Int. Cl.$^5$ .................. H01L 21/306; B44C 1/22
[52] U.S. Cl. .................. 156/643; 156/626; 156/345; 204/298.33
[58] Field of Search .......... 156/626, 643, 646, 651, 156/345; 204/192.32, 192.37, 298.31, 298.33, 298.37, 298.38

[56] References Cited

U.S. PATENT DOCUMENTS 5,250,137 10/1993 Arami et al. .................. 156/345

*Primary Examiner*—William Powell

[57] ABSTRACT

A method in which in case different kinds of processing are consecutively conducted in a single chamber of a plasma device, a residual portion of a processing gas used in one process is prevented from affecting a next process, is disclosed. A chemical species resulting from the processing gas in one process is prevented from being generated in forming a plasma in the next processing, by introducing an inactive gas after the processing gas used in one processing is exhausted once, or by introducing the inactive gas while exhausting the processing gas, or by cyclically repeating exhaust of the processing gas and introduction of the inactive gas, prior to the next process. The degree of exhaust may be monitored on the basis of an emission spectrum of the plasma. If the exhaust is carried out between a dry etching process conducted while holding a substrate on a single electrode electrostatic chuck and a process of removing residual charge of the chuck in a state of non-bias application to the substrate, or between a just etching process and an over etching process, deterioration of an etching shape due to radicals in the plasma may be prevented.

29 Claims, 7 Drawing Sheets

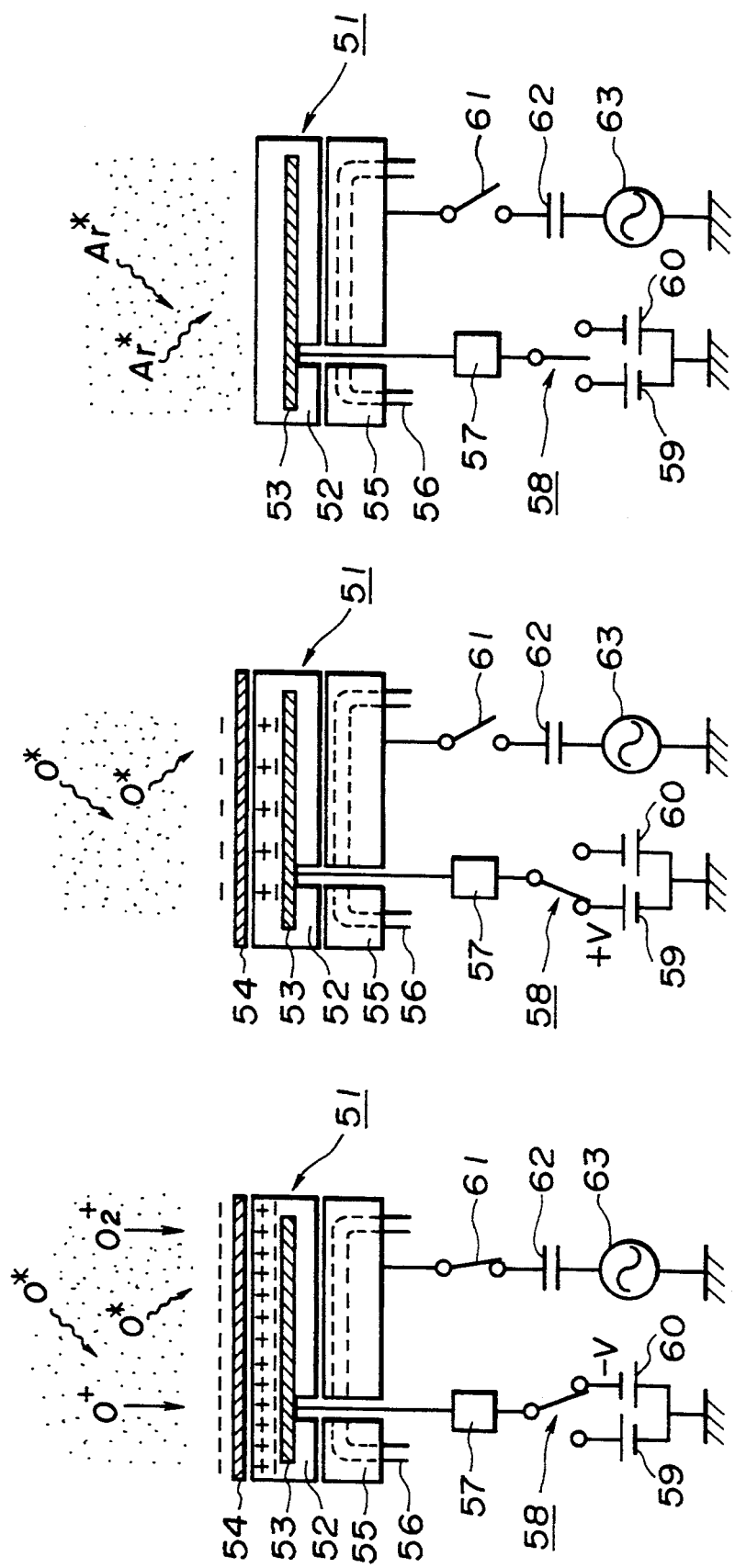

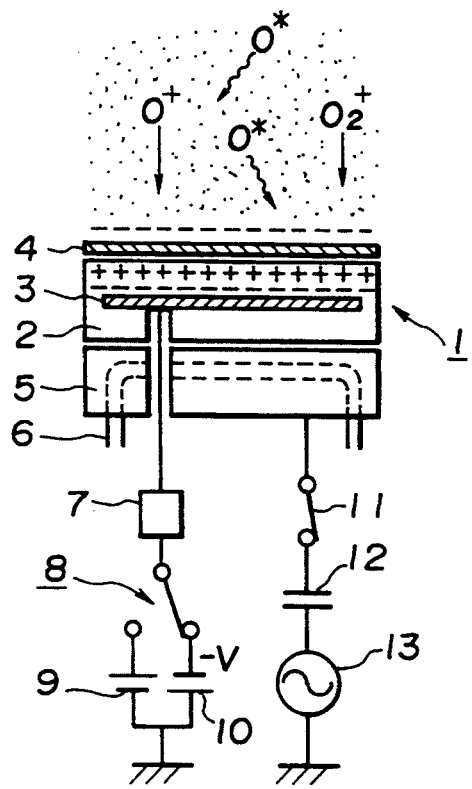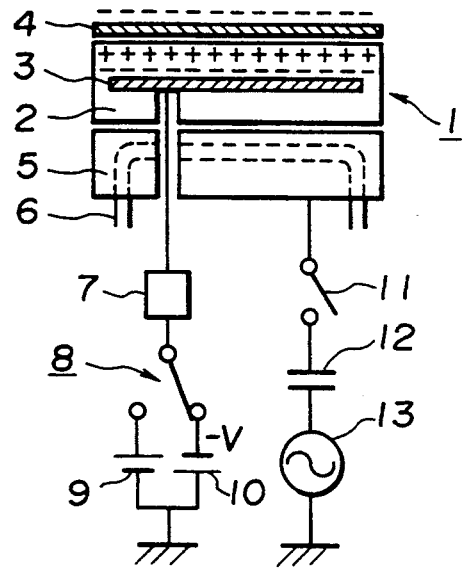
FIG.2A FIG.2B
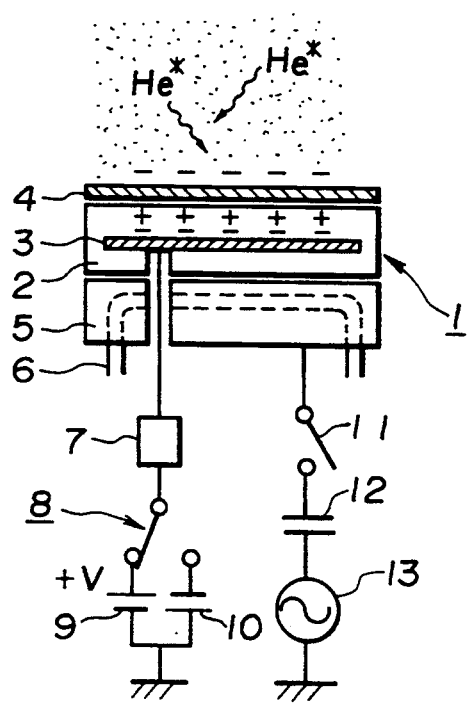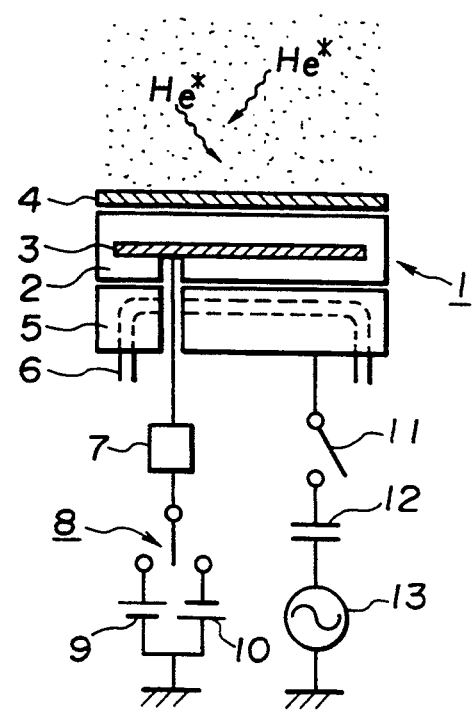
FIG.2C FIG.2D

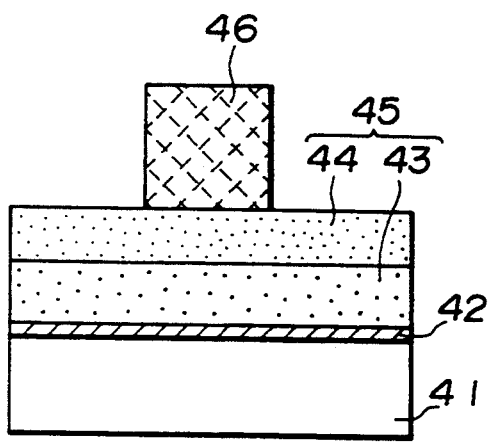
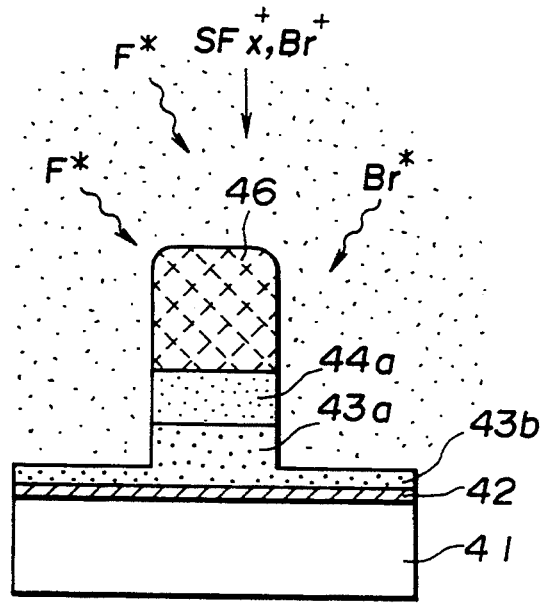
FIG.6A  FIG.6B
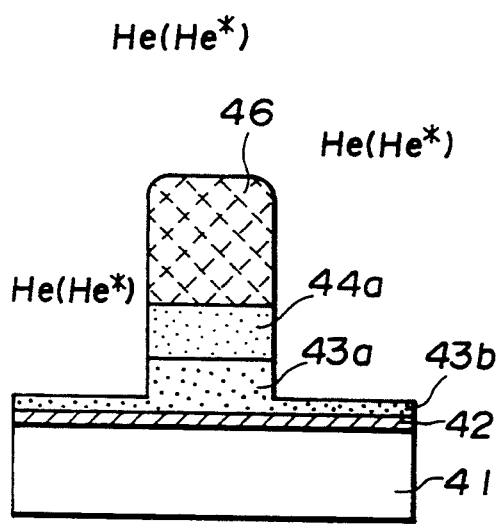
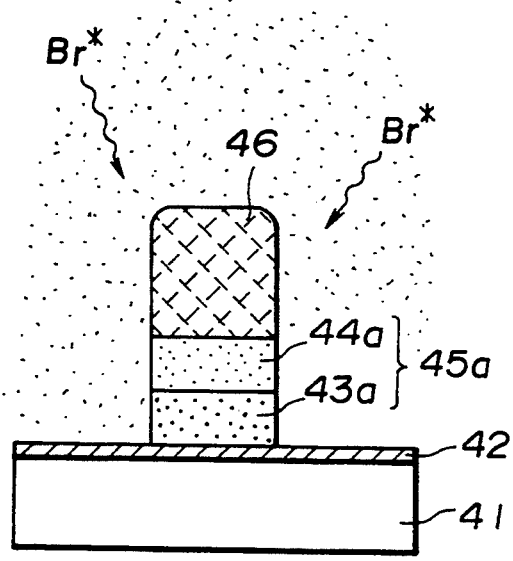
FIG.6C  FIG.6D

METHOD OF PRODUCING SEMICONDUCTOR DEVICE

BACKGROUND OF THE INVENTION

This invention relates to a method of producing semiconductor devices, and more particularly to a method for consecutively conducting different kinds of processing with processing conditions being changed within a single processing chamber of a plasma device, in which a processing gas used in one plasma processing will not affect the next processing.

As integration and performance of semiconductor devices have been improved, standards of technological requirements of various fine processing techniques have become higher. Particularly in recent years, there are several cases in which different kinds of processing are consecutively conducted within a single chamber of a plasma device, such as in a multi-layer film processing process, a process accompanying on/off switching of an electrostatic chuck, or a process having two-stage dry etching of just etching and over etching for attaining an ultra-high selective ratio.

The electrostatic chuck is a mechanism by which a dc voltage is applied to an internal electrode buried in an insulation member, so as to utilize a Coulomb force generated between the insulation member and a wafer set thereon, for adsorbing and fixing the wafer. For example, in dry etching techniques of recent years, especially in low-temperature etching for carrying out high anisotropic etching under low $V_{dc}$ (self-bias potential) conditions while limiting reactivity of radicals at a low temperature, it is necessary to level the heat transfer between the wafer stage and the wafer within a plane, so as to limit the in-plane distribution of the etch-rate to the minimum level. The electrostatic chuck is highly effective for holding the wafer in such case.

For the electrostatic chuck, there are several different formats depending on whether the wafer is a conductor, a semiconductor or dielectric, and whether the wafer is to be grounded or not. Among these formats, a so-called single electrode format is becoming the mainstream. In this single electrode electrostatic chuck, a dc voltage of predetermined polarity is applied to a single internal electrode in the insulation member, and a facing ground is taken through a processing chamber wall via a plasma. Although having inconvenience that the wafer cannot be adsorbed to the wafer stage in the absence of a plasma, the single electrode electrostatic chuck has a significant advantage of a low possibility that pressure proof of a gate oxide film of a MOS device is deteriorated.

In case the single electrode electrostatic chuck is used, electric charge remains even if the application of the dc voltage is stopped after the plasma processing, Therefore, in order to separate the wafer from the wafer stage, it is necessary to supply a gas which will not substantially affect the result of the plasma processing so as to re-generate the plasma, and then to release the residual charge through the plasma. It is possible to apply to the internal electrode a dc voltage of the polarity opposite to that of the dc used for the wafer adsorption, so as to forcibly remove the residual charge, thereby shortening the time for charge removal. However, excessive application of the voltage induces charge of the opposite polarity, thus re-charging the wafer stage.

In order to solve this problem, a technique of eliminating the charge to a certain extent by applying to the internal electrode a voltage of polarity opposite to that of the voltage used for wafer adsorption after the plasma processing, so as to separate the wafer, and then perfectly removing the residual charge through electric discharge processing using an inactive gas, is disclosed in the JP Patent KOKAI Publication Serial No.4-51642.

On the other hand, with ultra high-selective etching, it is often the case that the etching process for a material layer to be etched is divided into two stages, that is, a just etching process which continues shortly before the underlying material layer is substantially exposed, and an over etching process for etching a residual portion of the material layer to be etched.

A typical example for this two-stage etching is gate electrode processing for a MOS transistor, and more particularly, is the etching of a polysilicon layer or a tungsten polycide film on a gate oxide film consisting of $SiO_2$. In this gate electrode processing, high selectivity for a thin gate oxide film having a thickness of only about 10 mm must be achieved, while shortening duration of the entire process. For this reason, in a typical process example, high rate etching is carried out using $F^*$ as the main etchant in the just etching process, and high-selective etching is carried out using $Br^*$ as the main etchant in the over etching process.

The cases in which the different processes are consecutively carried out have been described, such as, the process of residual charge removal after the predetermined plasma processing for the wafer on the single electrode electrostatic chuck, arc the process of consecutively carrying out the just etching and the over etching. As the required standards for the fine processing increases, a problem of adverse effects of a residual gas in one process of plasma processing on the next process has been noted. That is, the problem is a reduction in shape anisotropy and underlying layer selectivity, due to the residual gas or a chemical species formed through reaction of the residual gas and a gas used in the next process.

First, the deterioration of the shape anisotropy is described, using an example of a process of residual charge removal after etching an underlying resist layer in a three-layer resist process, with reference to FIGS. 1A to 1C.

Referring to FIG. 1A, a wafer 54 is set on a single electrode electrostatic chuck 51 on a wafer stage 55 of a magnetically-enhanced microwave plasma etcher, and an underlying resist layer, not shown, on the wafer 54 is etched by using $O_2$ plasma. Although the wafer stage 55, the single electrode electrostatic chuck 51 and the wafer 54 are described as being separated from one another in FIG. 1A as a matter of convenience for schematic expression, the three parts are actually adhered to one another.

The single electrode electrostatic chuck 51 has a constitution in which a single internal electrode 53 is buried in an insulation member 52. A dc power source 59 capable of applying a positive dc voltage and a dc power source 60 capable of applying a negative dc voltage are connected, in parallel to each other, to the internal electrode 53 via a high frequency cutting filter 57 and a changeover switch 58. These dc power sources 59 and 60 are commonly grounded. In FIG. 1A, as the dc power source 60 is connected to the internal electrode 53, the internal electrode 53 is negatively charged. Consequently, the positive charge is induced to the surface of the insulation member 52, while the negative charge is induced to the surface of the wafer 54. The wafer 54 is adsorbed and held on the single electrode electrostatic chuck 51 by a Coulomb force between the negative charge of the wafer 54 itself and the positive charge of the surface of the insulation member 52. The facing ground is taken through a chamber wall, not shown, via $O_2$ plasma.

On the other hand, a cooling pipe 56 is buried in the wafer stage 55, so that the wafer 54 is cooled to a predetermined temperature by circulating an appropriate coolant in the cooling pipe 56. Also, an RF power source 63 is connected to the wafer stage 55 via a switch 61 and a blocking capacitor 62 for cutting off dc components.

During the etching, the switch 61 is turned on to apply an RF bias, thus producing a predetermined incident ion energy. This is because the underlying resist layer is etched on the basis of an isotropic burning reaction using oxygen radicals (O*) as the etchant, generating the necessity for securing shape anisotropy by ion assistance effects.

After etching the underlying resist layer, the process of residual charge removal is conducted. In this process, since the RF bias is not applied for securing sufficient underlying layer selectivity, the switch 61 is turned off to separate the RF power source 63 while the dc power source 59 is connected to the internal electrode 53 by operating the changeover switch 58, so as to apply a positive dc voltage, as shown in FIG. 1B. Thus, the charges on the surfaces of the internal electrode 53, the insulation member 52 and the wafer 54 are reduced.

In this case, however, since the application of the RF bias is stopped, O* randomly moving in the plasma dominates. Therefore, the sidewall surface of the pattern of the underlying resist layer which is anisotropically processed by O* is attacked and is isotropically etched.

Ultimately, the changeover switch 58 is turned off as shown in FIG. 1C, and an inactive gas such as Ar is introduced into the processing chamber. Then, the residual charge is perfectly removed by using a plasma formed on dissociation due to electric discharge of the inactive gas.

The above-described is an example in which shape anisotropy is lowered by residual O* in the residual charge removal process. There is also an example of adverse effects of another residual chemical species, in which selectivity for the gate oxide film in lowered, by a residual portion of F* in the just etching, in the over etching of the two-stage etching for gate electrode processing.

There is also an example of adverse effects of a chemical species formed by a reaction between the residual gas and a gas used in the next processing, in which underlying layer selectivity is lowered after the processing a connecting hole. A typical process of hole processing is to etch an $SiO_2$ interlayer insulation film using a fluorocarbon based gas. If $O_2$ is introduced shortly after this etching for the purpose of removing the residual charge, dissociation of the residual fluorocarbon based gas is facilitated, so as to increase the F* density in the plasma, thereby lowering underlying layer selectivity.

OBJECT AND SUMMARY OF THE INVENTION

It is an object of the present invention to provide a method of producing semiconductor devices, in which a processing gas used in one plasma processing will not affect the next processing in a process of consecutively carrying out different kinds of processes with processing conditions being changed in a single processing chamber of the plasma device, thus carrying out the next processing of high reliability.

According to the present invention, the basic idea is to exhaust a processing gas used in plasma processing in the processing chamber of the plasma device after this plasma processing, for excluding effects of residual portions of the processing gas. If the processing gas is once exhausted, no chemical species due to the processing gas is formed. Therefore, deterioration of anisotropy and underlying layer selectivity due to residual radicals will not be generated. In addition, even if a gas for the next processing is introduced, there is no fear of decomposition of the processing gas due to the residual gas or excessive generation of chemical species.

The exhaust of the processing gas may be carried out singly, or with introduction of an inactive gas which will not substantially affect the result of the predetermined plasma processing. In this case, it is possible to increase the exhausting speed by the substitution effect of the inactive gas.

Also, the inactive gas may be introduced after the processing gas is exhausted. In addition, the processing gas may be thoroughly exhausted by alternately repeating the exhaust of the processing gas and the introduction of the inactive gas. If the electric discharge is carried out after the introduction of the inactive gas, it is possible to effectively clean the inside of the processing chamber with the plasma of the inactive gas.

Further, if the exhausting state of the processing gas is monitored on the basis of an emission spectrum of a chemical species which can be formed from the processing gas on dissociation due to electric discharge, it is possible to confirm the progress state of the exhaust-/substitution process and to decide the end point. Specifically, the end point may be decided at the time when the emission spectrum intensity of the chemical species is sufficiently reduced. Thus, it is possible to omit an unnecessary exhaust operation and to carry out effective exhaust/substitution within a minimum time period.

The exhaust/substitution process as described above is highly effective, if it is conducted before shifting to the residual charge removal process after the predetermined plasma processing of the wafer held on the single electrode electrostatic chuck, or between the just etching process and the over etching process. Thus, there is no fear of the loss of anisotropy and underlying selectivity.

Accordingly, the present invention is highly effective for production of semiconductor devices designed on the basis of minute design rules and having large scale integration and high performance.

BRIEF DESCRIPTION OF THE DRAWINGS

FIGS. 1A to 1C are schematic cross-sectional views for explaining a sequence of residual charge removal. FIG. 1A shows an etching process. FIG. 1B shows a process of residual charge removal due to application of a dc voltage of the opposite polarity and a residual gas plasma, FIG. 1C shows a process of residual charge removal due to an Ar plasma.

FIGS. 2A to 2D are schematic cross-sectional views for explaining a process sequence in one embodiment to which the present invention is applied. FIG. 2A shows an etching process. FIG. 2B shows an exhaust process.

FIG. 2C is a process of residual charge removal due to application of a dc voltage of the opposite polarity and a He plasma. FIG. 2D shows a process of residual charge removal due to a He plasma.

FIG. 3A shows a state of a wafer before being etched. FIG. 3B shows a state in which an underlying resist pattern is formed.

FIG. 5A shows a state in which an underlying resist pattern is formed with a little undercut being generated under a middle layer pattern. FIG. 5B shows a state in which the cross-sectional shape of the underlying resist pattern is corrected by forming $CF_x$ polymer in the process of residual charge removal.

FIGS. 6A to 6D are schematic cross-sectional views sequentially showing a process example of polycide gate electrode processing. FIG. 6A shows a state of a wafer before being etched. FIG. 6B shows a state in which a polycide film is just-etched. FIG. 6C shows a state in which the etching gas is exhausted/substituted. FIG. 6D is a state in which the polycide film is over-etched.

DETAILED DESCRIPTION OF THE INVENTION

Figure 3:
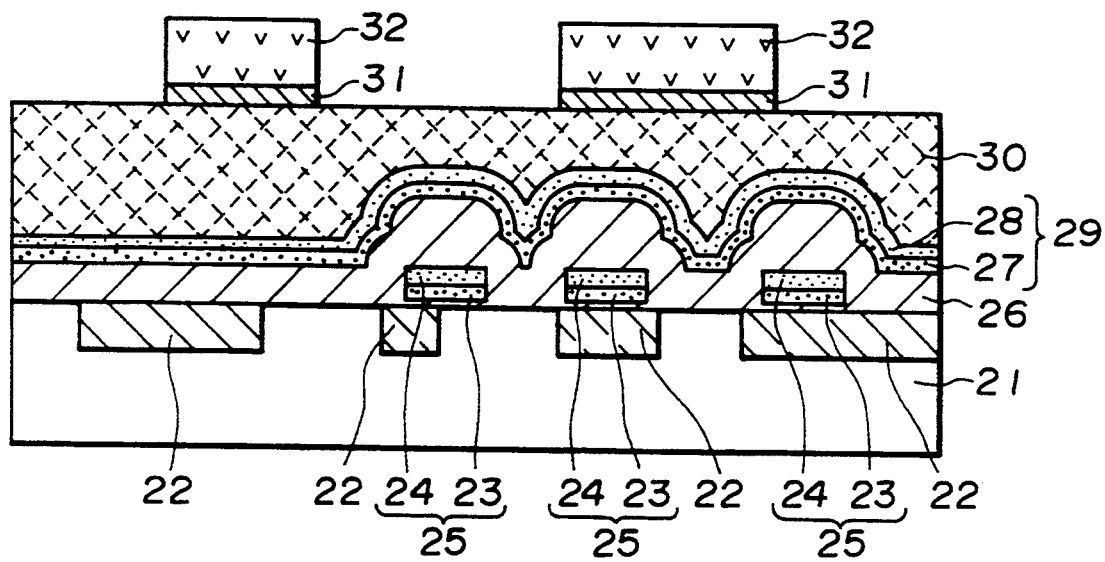
FIGS. 3A and 3B are schematic cross-sectional views sequentially showing an example of a three-layer resist process on the assumption of formation of an etching mask for SRAM bit line processing.
Figure 3:
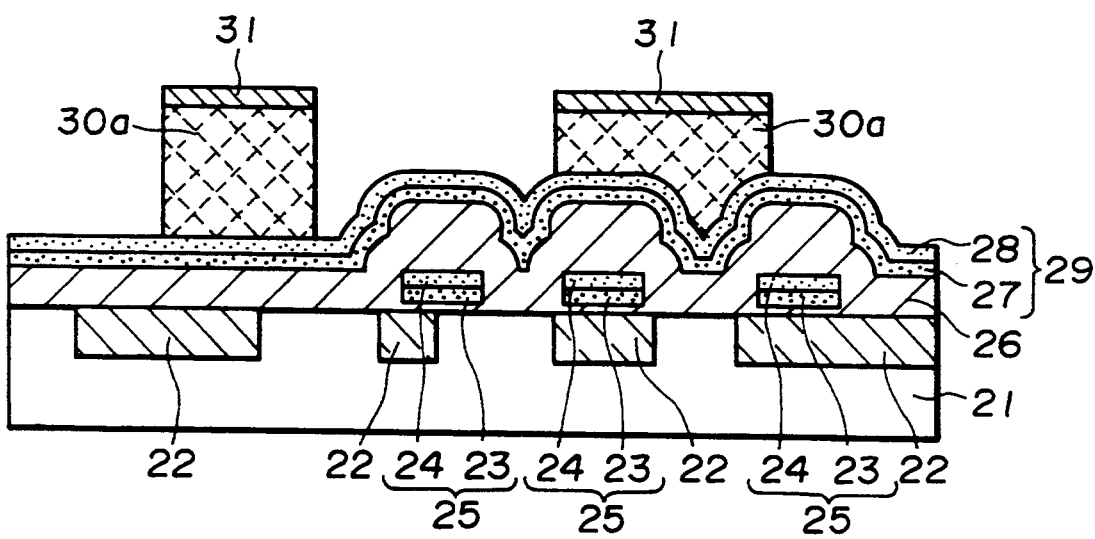

Preferred embodiments of the present invention will now be described in detail.

EXAMPLE 1

In the present example, a wafer was held on a wafer stage of a magnetically-enhanced microwave plasma etcher, using a single electrode electrostatic chuck, and an etching mask for SRAM bit line processing was formed by a three-layer resist process. Then, residual charge of the single electrode electrostatic chuck was removed.

First, a process sequence of the present embodiment will now be described with reference to FIGS. 2A to 2D.

In FIG. 2A, a wafer 4 is set on a single electrode electrostatic chuck 1 on a wafer stage 5 in a processing chamber, not shown, of a magnetically-enhanced microwave plasma etcher, and an underlying resist layer (30 in FIG. 3A) on the wafer 5 is etched using an $O_2$ plasma formed through electron cyclotron resonance (ECR) discharge.

The single electrode electrostatic chuck 1 has a constitution in which a single internal electrode 3 is buried in an insulation member 2. A dc power source 9 capable of applying a positive dc voltage and a dc power source 10 capable of applying a negative dc voltage are connected, in parallel to each other, to the internal electrode 3 via a high frequency cutting filter 7 comprised of a coil and via a changeover switch 8. These dc power sources 9 and 10 are commonly grounded. In FIG. 2A, as the dc power source 10 is connected, the internal electrode 3 is negatively charged. Consequently, a positive charge is induced to the surface of the insulation member 2 while a negative charge is induced to the surface of the wafer 4. The surface of the wafer 4 is negatively charged because of the negative self-bias of the wafer 4 due to the ECR discharge. The wafer 4 is adsorbed and held on the single electrode electrostatic chuck 1 by a Coulomb force between the negative charge of the wafer itself and the positive charge of the surface of the insulation member 2. A facing ground is taken through a chamber wall, not shown, via the $O_2$ plasma.

On the other hand, a cooling pipe 6 is buried in the wafer stage 5, so that the wafer 4 is cooled to a predetermined temperature by circulating an appropriate coolant in the cooling pipe 6. Also, an RF power source 13 is connected to the wafer stage 5 via a switch 11 and a blocking capacitor 12 for cutting off dc components.

During the etching, the switch 11 is turned on to apply an RF bias, thus producing a predetermined incident ion energy.

After the etching of the underlying resist layer, the supply of a microwave is stopped so as to suspend the ECR discharge, and the switch 11 is turned off not to apply the RF bias, as shown in FIG. 2B. Thus, $O_2$ is exhausted once.

Then, a He gas is introduced into a processing chamber and the microwave is re-supplied, thus forming an ECR plasma, as shown in FIG. 2C. It is possible to effectively reduce the residual charge on the surfaces of the internal electrode 3, the insulation member 2 and the wafer 4, by connecting the changeover switch 8 temporarily to the side of the dc power source 9 so as to turn the dc voltage applied to the internal electrode 3 to the opposite polarity.

In addition, the changeover switch 8 is turned off and the ECR discharge of the He gas is continued, as shown in FIG. 2D. The ECR plasma causes the residual charge to be eliminated, and causes the inside of the processing chamber to be cleaned.

Meanwhile, the above-described process is one example of the process sequence, allowing various modifications thereof.

For example, though the polarity of the dc voltage applied to the internal electrode 3 is changed in such an order that negative→positive→none in the above example, it may be that positive→negative→none.

Also, in the $O_2$ exhaust process shown in FIG. 2B, a He gas may be introduced at the time of the exhaust, so as to substitute for $O_2$.

A process example in which the above-described process sequence is applied to the etching of the underlying resist layer in actual SRAM bit line processing will now be described with reference to FIGS. 3A and 3B.

FIG. 3A is a schematic cross-sectional view showing an arrangement of a wafer before being etched.

That is, a gate electrode 25 made of a first-layer polycide film is formed via an $SiO_2$ gate oxide film on a silicon substrate 21 in which an element separation region 22 of shallow trench type is formed in advance. The gate electrode 25 is formed by a polysilicon layer 23 on the lower layer and a tungsten silicide ($WSi_x$) layer 24 on the upper layer being stacked thereon. In addition, the entire surface of the wafer is covered with an SiO$_2$ interlayer insulation film 26 formed by stacking SiO$_2$ by CVD, and a second-layer polycide film 29 is formed thereon. The second-layer polycide film 29, which is formed by a polysilicon layer 27 on the lower layer and a WSi$_x$ layer 28 on the upper layer being stacked thereon, is a portion constituting the SRAM bit line.

Further, in order to pattern the second-layer polycide film 29, a lower resist layer 30 is first formed with a thickness to substantially absorb the surface step of the wafer for flattening, and then a SOG middle layer pattern 31 and an upper resist pattern 32 are sequentially formed thereon.

The lower resist layer 30 is formed of, for example, a novolak positive type photoresist (trade name OFPR-800, made by Tokyo Oka Kogyo). The thickness of the lower resist layer 30 is approximately 1.0 μm in a thick portion.

The SOG middle layer pattern 31 is formed by forming a coating film with a thickness of about 0.15 μm using, for example, SOG (trade name OCD-type 2, made by Tokyo Oka Kogyo), and then carrying out reactive ion etching (RIE) with the upper resist pattern 32 as a mask, as later described. The etching condition in this RIE is: CHF$_3$ flow rate of 75 SCCM; O$_2$ flow rate of 8 SCCM; gas pressure of 6.5 Pa; and RF power of 1350 w (13.56 MHZ), using a hexode type RIE device.

The upper resist pattern 32 is formed by forming a coating film with a thickness of about 0.5 μm using, for example, a chemical amplification negative type three-component resist (trade name SAL-601, made by Shipley Co.), and then patterning by using a KrF excimer laser stepper.

Then, for etching the under resist layer 30, the wafer was set on the single electrode electrostatic chuck 1 in the processing chamber of the magnetically-enhanced microwave plasma etcher, and an O$_2$ gas was introduced in the processing chamber. In the cooling pipe 6 provided within the wafer stage 5, an alcohol based coolant was supplied and circulated from a chiller, not shown, provided outside the device.

An example of etching conditions is shown as follows.

| O$_2$ flow rate | 10 SCCM |
| --- | --- |
| gas pressure | 0.27 Pa |
| microwave power | 900 W (2.45 GHz) |
| RF bias power | 100 W (800 kHz) |
| wafer temperature | −50° C. |
| dc voltage to internal electrode | −600 V |

In this etching process, anisotropic etching proceeded wish a mechanism that the burning reaction of the upper resist pattern 32 and the lower resist layer 30 due to O* is assisted by the incident ion energy of O$_x$+. The upper resist pattern 32 was eliminated in the process, and then the middle layer pattern 31 functioned singly as the etching mask. As a result, a lower resist pattern 30a having a highly anisotropic shape was formed, as shown in FIG. 3B.

After this etching, the O$_2$ gas was exhausted as shown in FIG. 2B. The exhaust time was set to 10 minutes, and the ultimate vacuum was set to 1×10$^{-3}$ Pa. Since the switch 11 was turned off so as not to apply RF bias power, the sputtering of the underlying second-layer polycide film 29 due to unnecessary ions was not carried out.

Then, the residual charge was removed, for example, under the following conditions.

| He flow rate | 50 SCCM |
| --- | --- |
| gas pressure | 0.67 Pa |
| microwave power | 1200 W (2.45 GHz) |
| RF bias power | 0 W |
| wafer temperature | −50° C. |
| discharging time | 15 seconds |
| dc voltage to internal electrode | +100 V (for first 0.2 seconds) 0 V (for remaining 14.8 seconds) |

In this plasma processing, a dc voltage of the opposite polarity was applied to the internal electrode 3 for the first 0.2 seconds of the total processing time of 15 seconds, as shown in FIG. 2C, while the dc voltage was not applied for the remaining time, as shown in FIG. 2D. In this manner, the residual charge was removed almost perfectly. Meanwhile, the total processing time is set to have a certain margin, and therefore may be shortened depending on conditions.

In addition, since few O* existed in the plasma, the anisotropic shape of the lower resist pattern 30a achieved by the preceding etching was not deteriorated, even though the RF bias power was not applied.

Meanwhile, the above-mentioned process is different from the conventional process described with reference to FIGS. 1A to 1C, in that the wafer 4 remains to be set on the wafer stage 5 until the removal of the residual charge is finished. This is highly advantageous for preventing the wafer crack in separating the wafer 4 from the wafer stage 5, and for preventing plasma irradiation damages affecting the surfaces of the wafer stage 5 and the single electrode electrostatic chuck 1.

COMPARATIVE EXAMPLE

In the present comparative example, the O$_2$ exhaust process described above in example 1 was omitted, and the residual charge removal was carried out shortly after the etching of the lower resist layer 30. That is, the state shown in FIG. 2B is omitted, and O* co-exists with He* in the plasma in the states of FIGS. 2C and 2D.

Figure 4:
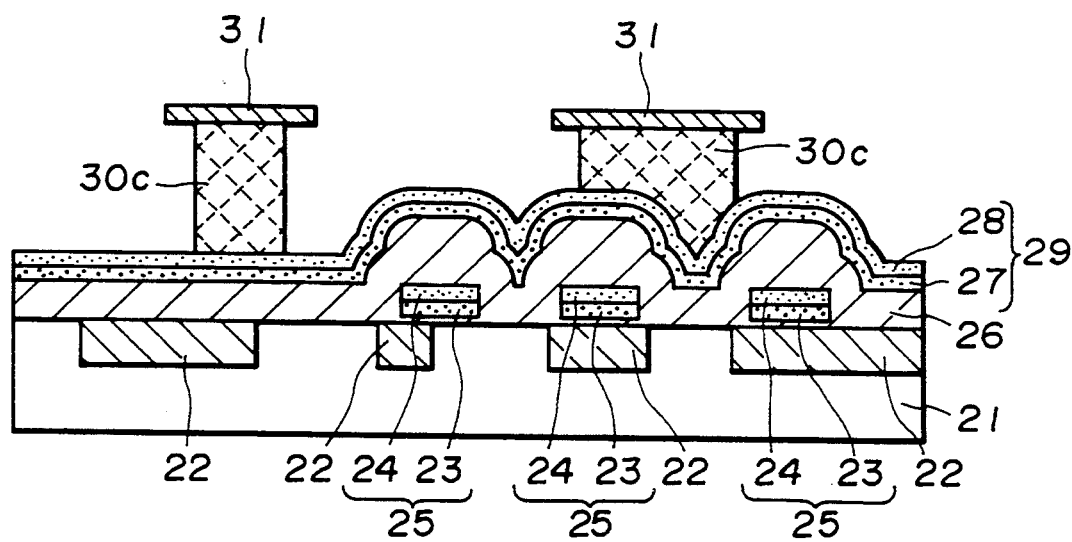
FIG. 4 is a schematic cross-sectional view showing a state in which an underlying resist pattern is formed with a large undercut being generated under a middle layer pattern, in a comparative example of the three-layer resist process on the assumption of formation of an etching mask for SRAM bit line processing.

When the residual charge removal was carried out in accordance with such a process sequence, the anisotropic shape of the lower resist pattern 30a shown in FIG. 3B was lost, and a lower resist pattern 30c having an undercut was produced, as shown in FIG. 4. This is because the residual O* in the gaseous phase isotropically etched the lower resist pattern 30a from its sidewall surfaces at the time when the application of the RF' bias power was stopped.

EXAMPLE 2

In the present example, gas compositions different from that of example 1 was employed for the etching of the lower resist layer 30 and the residual charge removal. That is, an O$_2$/Cl$_2$ mixed gas was used for the etching of the lower resist layer 30, while an N$_2$ gas was used for the residual charge removal.

An example of etching conditions for the lower resist layer 30 is shown as follows.

| O$_2$ flow rate | 8 SCCM |
| --- | --- |
| Cl$_2$ flow rate | 2 SCCM |
| gas pressure | 0.27 Pa |
| microwave power | 900 W (2.45 GHz) |
| RF bias power | 100 W (800 kHz) |

| | |
|---|---|
| -continued | |
| wafer temperature | −30° C. |

In these etching conditions, Cl₂ was added to the etching gas composition, in expectation of sidewall protection effects due to an etching reaction product, $CCl_x$ polymer, which has a low vapor pressure when cooled at a low temperature. Actually, despite the higher wafer temperature than in example 1, the lower resist pattern 30a having a highly anisotropic shape was able be formed.

Then, O₂ and Cl₂ were exhausted. The exhaust time was 10 seconds and the ultimate vacuum was $5 \times 10^{-3}$ Pa.

Further, the residual charge was removed, for example, under the following conditions.

| | |
|---|---|
| N₂ flow rate | 50 SCCM |
| gas pressure | 0.67 Pa |
| microwave power | 1200 W (2.45 GHz) |
| RF bias power | 0 W |
| wafer temperature | −30° C. |
| discharging time | 15 seconds |
| dc voltage to internal electrode | +100 V (for first 0.2 seconds) 0 V (for remaining 14.8 seconds) |

In the present example, the sidewall protection effects due to $CCl_x$ polymer were utilized in the previous etching process. However, sidewall protection films, not shown, formed in this process do not have a uniform thickness to be adhered to the pattern sidewalls. Accordingly, if the residual charge removal is carried out with the exhaust process being omitted, isotropic etching proceeds from the portion having a thin sidewall protection film, causing the cross-sectional shape of the lower resist pattern 30a to be deteriorated in a complex manner.

However, according to the present example, the residual charge was able to be removed, while maintaining the highly anisotropic shape of the lower resist pattern 30a.

EXAMPLE 3

In the present example, O₂ used for etching was exhausted by substituting He for O₂.

First, the lower resist layer 30 was etched using O₂ under the same conditions as in example 1, and exhaust/substitution was carried out, for example, under the following conditions.

| | |
|---|---|
| He flow rate | 50 SCCM |
| gas pressure | 0.67 Pa |
| microwave power | 0 W |
| RF bias power | 0 W |
| wafer temperature | −50° C. |
| exhaust time | 2 seconds |

In the present example, the exhaust time was able to be shortened to 2 seconds by simultaneously carrying out exhaust of O₂ and substitution by He, and therefore, a reduction in throughput was able to be limited to the minimum.

Then, electric discharge was carried out, for example, under the following conditions.

| | |
|---|---|
| microwave power | 1200 W (2.45 GHz) |
| -continued | |
| discharging time | 15 seconds |

Thus, the residual charge was removed almost perfectly, and the inside of the processing chamber was cleaned.

EXAMPLE 4

In the present example, a depositional $CH_2F_2$ gas was used in the process of residual charge removal, for the purpose of higher shape control. This process is described with reference to FIGS. 5A and 5B.

Figure 5:
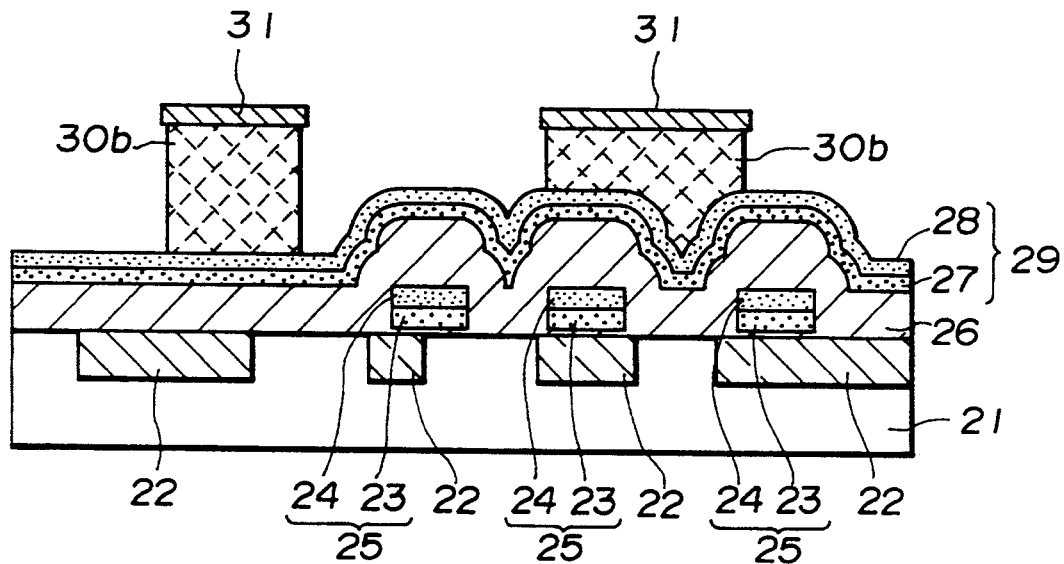
FIGS. 5A and 5B are schematic cross-sectional views sequentially showing another example of the three-layer resist process on the assumption of formation of an etching mask for SRAM bit line processing.
Figure 5:
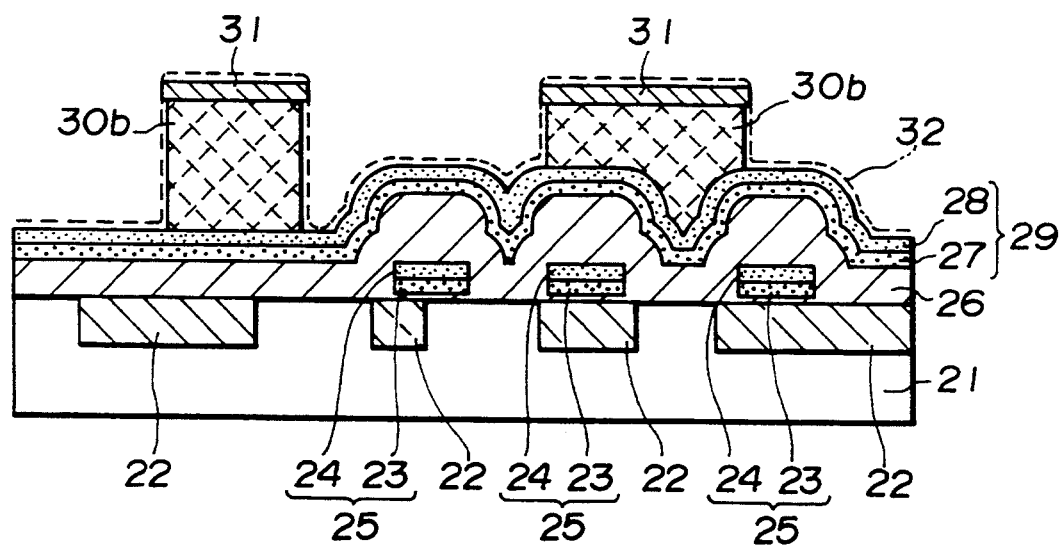

First, the etching of the lower resist layer 30 using O₂ and exhaust of O₂ were carried out under the same conditions as in example 1. Up to this stage, however, a lower resist patter 30b having a slight undercut was formed, as shown in FIG. 5A, depending on the timing of the turning off of the switch 11 and the exhaust. This undercut was generated in the form of retreating inside about 0.02 μm from an edge of the middle layer pattern 31.

Then, the residual charge removal was carried out, for example, under the following conditions, and the cross-sectional shape of the lower resist pattern 30b was corrected.

| | |
|---|---|
| CH₂F₂ flow rate | 10 SCCM |
| gas pressure | 0.67 Pa |
| microwave power | 1200 W (2.45 GHz) |
| RF bias power | 0 W |
| wafer temperature | −50° C. |
| exhaust time | 10 seconds |

A $CF_x$ polymer 32 formed in the plasma by the electric discharge was deposited with a thickness of about 0.02 to 0.03 μm on the entire surface of the wafer under the condition of non-bias application. The deposition thickness is sufficient for compensating the undercut and flattening the pattern sidewall surface. Thus, the cross-sectional shape of the lower resist pattern was corrected as shown in FIG. 5B. Meanwhile, the $CF_x$ polymer 32 deposited on the exposed surface of the second-layer polycide film 29 has the above-mentioned small thickness, and therefore can easily be removed before the second-layer polycide film 29 is etched so as to carry out bit line processing in a latter process.

EXAMPLE 5

In the present example, after just etching was finished in polycide gate electrode processing, exhaust/substitution of an etching gas used for the just etching was carried out by dividing the process thereof into several times, that is, by cycle purge. In this manner, exhaust/substitution efficiency was improved. The etching process at this time is now described with reference to FIGS. 6A to 6D.

A wafer used as an etching sample in the present example is constituted by a polycide film 45 stacked on a single crystal silicon substrate 41 via a thin gate oxide film 42, with a resist pattern 46 being formed in a predetermined shape on the polycide film 45, as shown in FIG. 6A. The polycide film 45 is constituted by stacking, from the bottom, a polysilicon layer 43 having a thickness of about 100 mm and a $WSi_x$ layer 44 having a thickness of about 100 mm.

The wafer was set on the RF-bias magnetically-enhanced microwave plasma etcher, and the polycide film 45 was just-etched, for example, under the following conditions.

| | |
|---|---|
| $SF_6$ flow rate | 30 SCCM |
| HBr flow rate | 20 SCCM |
| gas pressure | 1.3 Pa |
| microwave power | 900 W (2.45 GHz) |
| RF bias power | 200 W (400 kHz) |
| wafer temperature | $-40°$ C. |

The just etching was finished shortly before the underlying gate oxide film 42 was exposed, as shown in FIG. 6B.

In this process, high-rate etching due to F* and high selective etching due to Br* proceeded with assistance of incident energies of ions such as $SF_x{}^+$ and $Br^+$. Also, since the wafer was cooled to a low temperature, $SiBr_x$ having a low vapor pressure was deposited on the pattern sidewalls, forming sidewall protection films, not shown. Meanwhile, the pattern formed by etching is denoted by reference numbers of the original material layers with an additional character a, in FIG. 6B.

In this manner, the etching gas has a gas composition capable of conducting high-selective processing. However, if over etching is directly carried out without changing any condition, underlying selectivity and shape anisotropy, particularly shape anisotropy of a lower layer polysilicon pattern 43a, may be deteriorated by the residual F*.

Thus, the cycle purge was carried out, for example, under the following conditions.

| | |
|---|---|
| exhaust process: | |
| ultimate vacuum | $10^{-2}$ Pa or lower |
| He substitution process: | |
| flow rate | 100 SCCM |
| gas pressure | 3 Pa |
| substitution time | 10 seconds |

The exhaust process and the He substitution process were alternately repeated three times, with the total processing time of approximately 1 minute. Thus, the only chemical species present in the gaseous phase was substantially He, as shown in FIG. 6C.

After that, the polycide film 45 was over-etched, for example, under the following conditions.

| | |
|---|---|
| HBr flow rate | 50 SCCM |
| gas pressure | 1.3 Pa |
| microwave power | 900 W (2.45 GHz) |
| RF bias power | 15 W (400 kHz) |
| wafer temperature | $-40°$ C. |

In this process, as F* was removed almost perfectly from the gaseous phase, a gate electrode 45a having a highly anisotropic shape was formed, as shown in FIG. 6D. In addition, the main etchant in this process was Br*, and the RF bias power was reduced. Therefore, a high selective ratio of not lower than 100 was achieved for the underlying $SiO_2$ interlayer insulation film 26.

EXAMPLE 6

In the present example, electric discharge of He was carried out as a modification of the cycle purge in example 5.

First, the polycide film 45 was just-etched in a similar manner to example 5. Then, the cycle purge was carried out, for example, under the following conditions.

| | |
|---|---|
| exhaust process: | |
| ultimate vacuum | $10^{-2}$ Pa or lower |
| He substitution process: | |
| flow rate | 100 SCCM |
| gas pressure | 2 Pa |
| microwave power | 1200 W (2.45 GHz) |
| wafer temperature | $-40°$ C. |
| discharging time | 10 seconds |

The exhaust process and the He substitution process wire alternately repeated three times, with the total processing time of approximately 1 minute. Thus, the only chemical species present in the gaseous phase was substantially He*, as shown in FIG. 6C.

Figure 7:
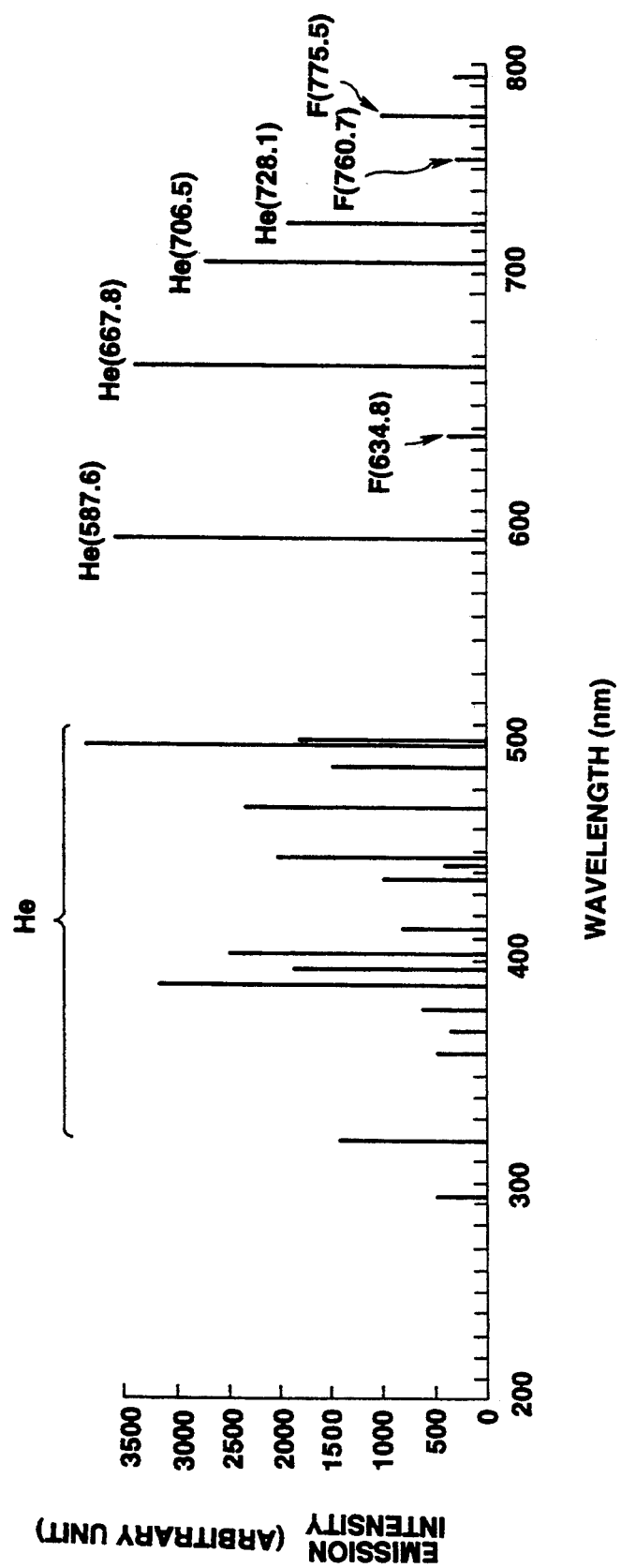
FIG. 7 is a chart showing an emission spectrum observed in case electric discharge is carried out in the exhaust/substitution process of FIG. 6C.

The degree to which the exhaust and the substitution proceeded was confirmed in situ by monitoring an emission spectrum of F*. The emission spectrum is shown in FIG. 7. The emission peaks due to F* are observed at 634.8 mm, 760.7 mm and 775.5 mm. The cycle purge was finished at the time when these peaks were extinguished, or when the peak height, that is, the emission intensity was equal to a background value.

After that, over etching was carried out in a similar manner to example 5, thus carrying out high-selective, high-anisotropic processing.

The present invention has been described on the basis of the above six examples. However, the present invention is not limited to these examples.

For example, the process to which the present invention is applicable is not limited to the etching of the lower resist layer or the polycide film, but can be any other process in which selectivity and anisotropy may be deteriorated by a residual gas used in a preceding process.

In addition, it is a matter of course that wafer constitution, etching conditions, exhaust conditions, kinds of devices to be used, and composition of etching gases and inactive gases can be changed suitably.

What is claimed is:

1. A method of producing a semiconductor device by first conducting plasma processing of a wafer held in a processing chamber of a plasma device by using a plasma formed on dissociation due to electric discharge of a processing gas within the processing chamber, and then conducting a next processing with changed discharging conditions within the same processing chamber, said method comprising the further step of:
   evacuating said processing gas after said said plasma processing step and before said next processing step.

2. The method of producing a semiconductor device as claimed in claim 1, in which a pressure within the processing chamber is set to $1 \times 10^{-2}$ Pa and lower through the step of evacuating said processing gas.

3. The method of producing a semiconductor device as claimed in claim 1, in which said plasma processing is a dry etching process for said wafer held on a wafer stage provided with a single electrode electrostatic chuck arranged in said processing chamber; and
   said next processing step is a process of residual charge removal from said wafer held on the wafer stage provided with the single electrode electrostatic chuck.

4. The method of producing a semiconductor device as claimed in claim 1, in which residual charge removal from said wafer held on the wafer stage provided with the single electrode electrostatic chuck is carried out, using a plasma formed on dissociation due to electric discharge of at least one gas selected from the group consisting of He, Ne, Ar, $N_2$, $CH_3F$, $CH_2F_2$ and $CHF_3$, in said next processing step.

5. The method of producing a semiconductor device as claimed in claim 1, in which said plasma processing is a just etching process for etching a material layer to be etched on said wafer substantially for layer thickness thereof; and
said next processing step is an over etching process for etching a residual portion of the material layer to be etched.

6. a method of producing a semiconductor device by first conducting plasma processing of a wafer held in a processing chamber of a plasma device by using a plasma formed on dissociation due to electric discharge of a processing gas within the processing chamber, and then conducting a next processing step with changed discharging conditions within the same processing chamber, said method comprising the first step of:
introducing into said processing chamber an inactive gas which has substantially no effects on a result of said plasma processing while evacuating said processing gas after said plasma processing and before said next processing step.

7. The method of producing a semiconductor device as claimed in claim 6, in which said inactive gas is at least one gas selected from the group consisting of H3, Ne, Ar and $N_2$.

8. The method of producing a semiconductor device as claimed in claim 6, in which electric discharge is carried out after said inactive gas is introduced.

9. The method of producing a semiconductor device as claimed in claim 6, in which a state of evacuation of said processing gas is monitored on the basis of an emission spectrum of a chemical species being able to be formed by said processing gas on dissociation due to electric discharge.

10. The method of producing a semiconductor device as claimed in claim 6, in which said plasma processing is a dry etching process for said wafer held on a wafer stage provided with a single electrode electrostatic chuck arranged in said processing chamber; and
said next processing step is a process of removing residual charge from said wafer held on the wafer stage, which is provided with the single electrode electrostatic chuck.

11. The method of producing a semiconductor device as claimed in claim 6, in which said plasma processing is a just etching process for etching a material layer to be etched on said wafer substantially for layer thickness thereof; and
said next processing step is an over etching process in which a residual portion of the material layer to be etched is etched.

12. A method of producing a semiconductor device by first conducting plasma processing of a wafer held in a processing chamber of a plasma device by using a plasma formed on dissociation due to electric discharge of a processing gas within the processing chamber, and then conducting a next processing step with changed discharging conditions within the same processing chamber, said method comprising the further step of:
introducing a depositional gas into said processing chamber while evacuating said processing gas after said plasma processing and before said next processing step.

13. The method of producing a semiconductor device as claimed in claim 12, in which said depositional gas includes at least one gas selected from the group consisting of $CH_3F$, $CH_2F_2$ and $CHF_3$.

14. The method of producing a semiconductor device as claimed in claim 12, in which electric discharge is carried out after said depositional gas is introduced.

15. The method of producing a semiconductor device as claimed in claim 12, in which a state of evacuation of said processing gas is monitored on the basis of an emission spectrum of a chemical species being able to be formed by said processing gas on dissociation due to electric discharge.

16. The method of producing a semiconductor device as claimed in claim 12, in which said plasma processing is a dry etching process for said wafer held on a wafer stage provided with a single electrode electrostatic chuck arranged in said processing chamber; and
said next processing step is a process of removing residual charge from said wafer held on the wafer stage which is provided with the single electrode electrostatic chuck.

17. The method of producing a semiconductor device as claimed in claim 12, in which said plasma processing is a just etching process for etching a material layer to be etched on said wafer substantially for layer thickness thereof; and
said next processing step is an over etching process in which a residual portion of the material layer to be etched is etched.

18. A method of producing a semiconductor device by first conducting plasma processing of a wafer held in a processing chamber of a plasma device by using a plasma formed on dissociation due to electric discharge of a processing gas within the processing chamber, and then conducting a next processing step with changed discharging conditions within the same processing chamber, said method comprising the further step of:
evacuating said processing gas, and then introducing into said processing chamber an inactive gas which does not substantially affect a result of said plasma processing, at least once each, between said predetermined plasma processing and said next processing step.

19. The method of producing a semiconductor device as claimed in claim 18, in which said inactive gas is at least one gas selected from the group consisting of He, Ne, Ar and $N_2$.

20. The method of producing a semiconductor device as claimed in claim 18, in which electric discharge is carried out after said inactive gas is introduced.

21. The method of producing a semiconductor device as claimed in claim 18, in which a state of evacuation of said processing gas is monitored on the basis of an emission spectrum of a chemical species being able to be formed by said processing gas on dissociation due to electric discharge.

22. The method of producing a semiconductor device as claimed in claim 18, in which said plasma processing is a dry etching process for said wafer held on a wafer stage provided with a single electrode electrostatic chuck arranged in said processing chamber; and
said next processing step is a process of removing residual charge from said wafer held on the wafer stage, in which provided with the single electrode electrostatic chuck.

23. The method of producing a semiconductor device as claimed in claim 18, in which said plasma processing is a just etching process for etching a material layer to be etched on said wafer substantially for layer thickness thereof; and said next processing step is an over etching process in which a residual portion of the material layer to be etched is etched.

24. A method of producing a semiconductor device by first conducting plasma processing of a wafer held in a processing chamber of a plasma device by using a plasma formed on dissociation due to electric discharge of a processing gas within the processing chamber, and then conducting a next processing step with changed discharging conditions within the same processing chamber, said method comprising the further steps of:

evacuating said processing gas, and then introducing a depositional gas into said processing chamber, at least once each, between said predetermined plasma processing and said next processing.

25. The method of producing a semiconductor device as claimed in claim 24, in which said plasma processing is a dry etching process for said wafer held on a wafer stage provided with a single electrode electrostatic chuck arranged in said processing chamber; and said next processing step is a process of removing residual charge from said wafer held on the wafer stage, which is provided with the single electrode electrostatic chuck.

26. The method of producing a semiconductor device as claimed in claim 24, in which said plasma processing is a just etching process for etching a material layer to be etched on said wafer substantially for layer thickness thereof; and said next processing step is an over etching process in which a residual portion of the material layer to be etched is etched.

27. The method of producing a semiconductor device as claimed in claim 24, in which a state of evacuation of said processing gas is monitored on the basis of an emission spectrum of a chemical species being able to be formed by said processing gas on dissociation due to electric discharge.

28. The method of producing a semiconductor device as claimed in claim 24, in which said predetermined plasma processing is a dry etching process for said wafer held on a wafer stage provided with a single electrode electrostatic chuck arranged in said processing chamber; and said next processing is a process of residual charge removal from said wafer held on the wafer stage provided with the single electrode electrostatic chuck.

29. The method of producing a semiconductor device as claimed in claim 24, in which said predetermined plasma processing is a just etching process for etching a material layer to be etched on said wafer substantially for layer thickness thereof; and said next processing is an over etching process for etching a residual portion of the material layer to be etched.

* * * * *